United States Patent [19]

Stridsberg

[11] Patent Number: 5,012,874
[45] Date of Patent: May 7, 1991

[54] MOVABLE TOOL HEAD FOR MOUNTING MACHINES AND A ROTATABLE, AXIALLY MOVABLE SHAFT THEREFOR

[75] Inventor: Lennart Stridsberg, Enskede, Sweden

[73] Assignee: Mydata Automation AB, Sweden

[21] Appl. No.: 318,291

[22] Filed: Mar. 3, 1989

[30] Foreign Application Priority Data

Mar. 4, 1988 [SE] Sweden .................................. 8800779

[51] Int. Cl.⁵ .............................................. B23P 11/00
[52] U.S. Cl. .................................... 173/108; 29/281.4;
74/89.22; 74/479; 173/48; 173/104; 173/114;
384/55; 384/57; 384/58; 464/97; 901/46
[58] Field of Search .................... 29/281.4, 739, 740,
29/741, 743, 759; 269/71; 74/826, 479, 665 C,
89.22; 384/55, 57, 58; 464/79, 80, 97, 183;
33/559, 645; 414/590, 744.3, 751; 901/46

[56] References Cited

U.S. PATENT DOCUMENTS

| | | | |
|---|---|---|---|
| 2,525,712 | 10/1950 | Neighbour | 384/55 |
| 2,918,333 | 12/1959 | Friedman | 384/55 X |
| 3,427,080 | 2/1969 | Folk | 384/55 |
| 3,709,379 | 1/1973 | Kaufeldt | 901/13 X |
| 3,747,367 | 7/1973 | Muller | 464/79 X |
| 4,375,195 | 3/1983 | Tsubol | 384/58 X |
| 4,611,397 | 9/1986 | Janisiewicz et al. | 29/740 X |
| 4,656,881 | 4/1987 | Goedecke et al. | 384/55 X |
| 4,715,730 | 12/1987 | Magnuson | 384/58 X |

FOREIGN PATENT DOCUMENTS

| | | | |
|---|---|---|---|
| 0851285 | 10/1952 | Fed. Rep. of Germany | 464/79 |
| 1190265 | 4/1965 | Fed. Rep. of Germany | |
| 3436977 | 4/1986 | Fed. Rep. of Germany | |
| 1015258 | 9/1952 | France | 464/79 |
| 339807 | 2/1970 | Sweden | |
| 8203572 | 6/1984 | Sweden | |
| 0067945 | 2/1915 | Switzerland | 464/79 |

Primary Examiner—Mark Rosenbaum
Assistant Examiner—Frances Chin
Attorney, Agent, or Firm—Townsend and Townsend

[57] ABSTRACT

The present invention relates to a tool head being movable between a component supply and a place, where a component is to be mounted. The tool head comprises a tool shaft (1). This can rotate in relation to the base structure of said tool head and is also axially displaceable in relation to said base. To reduce the inertia of the mass to be displaced and rotated the tool shaft (1) is irrotationally and axially movably supported in a front bearing (3). This front bearing (3) is rotatably and not axially movably supported in the base plate. The rotation of said bearing element (3) is realized by means of a driving motor (9) and a toothed belt (7). The shaft (1) is driven axially by a second driving motor (25) also provided with a driving belt (23). To this driving belt a support element (17) is attached. The support element (37) is guided by a linear guide bar (21) and is also connected to said tool shaft (1). This connection allows the rotational movement of said tool shaft (1) in relation to said support element (17) but not translational axial movements. In this way it is obtained that the movable element, in this case the tool shaft (1), has a small inertial mass as possible. The invention also relates to a tool shaft (1) of the kind mentioned.

5 Claims, 5 Drawing Sheets

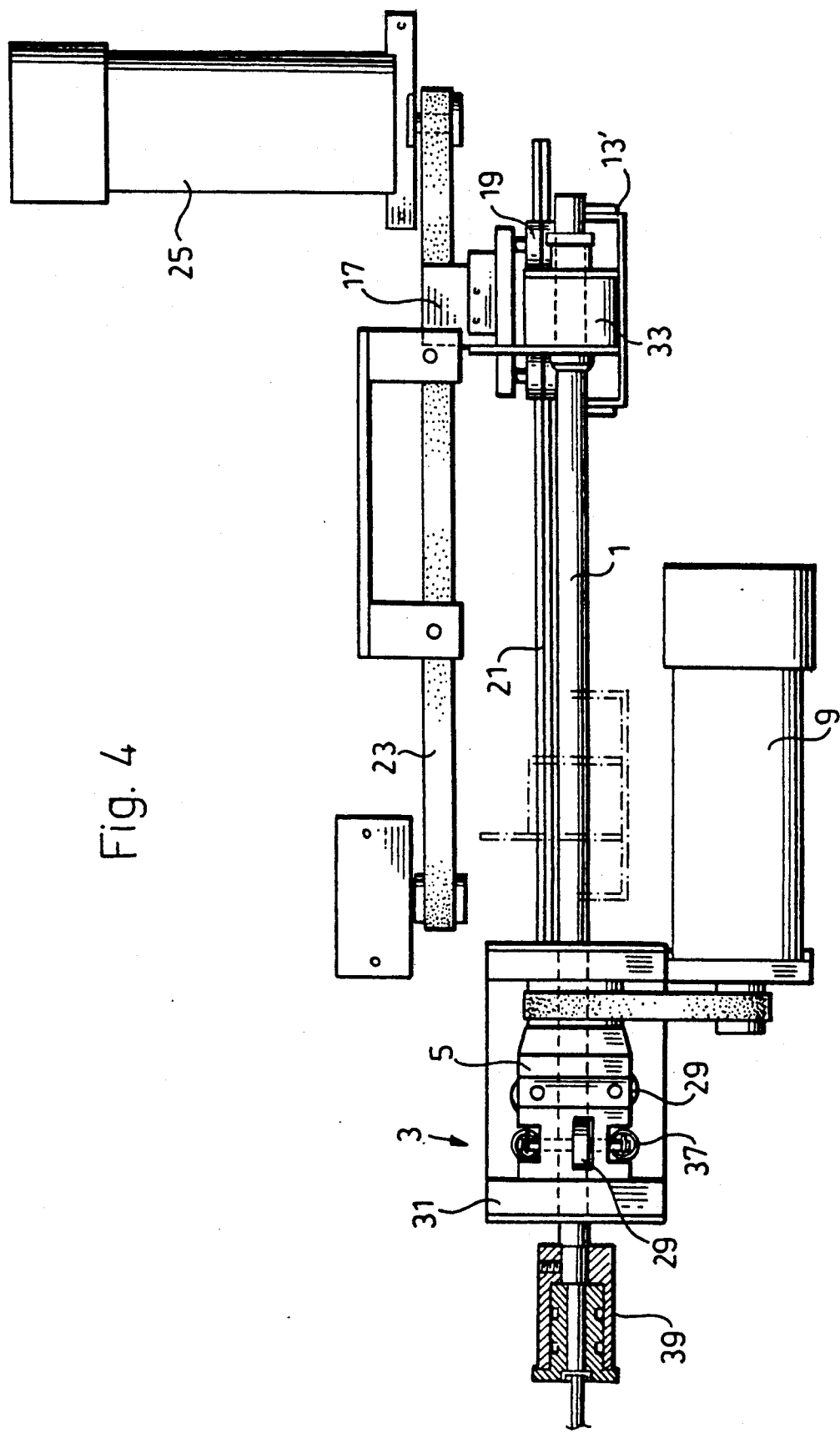

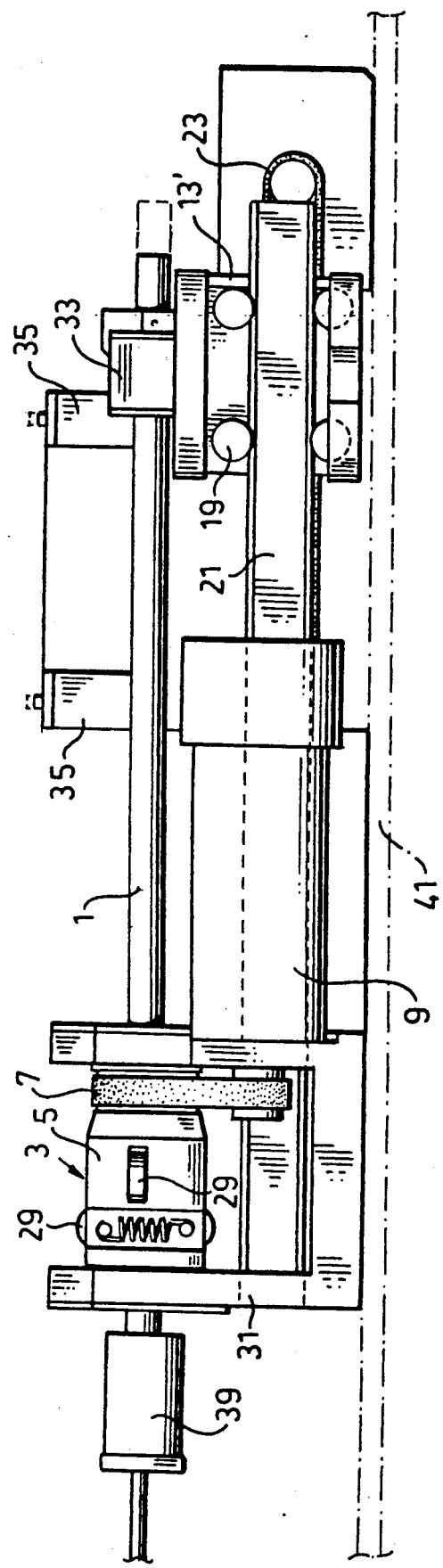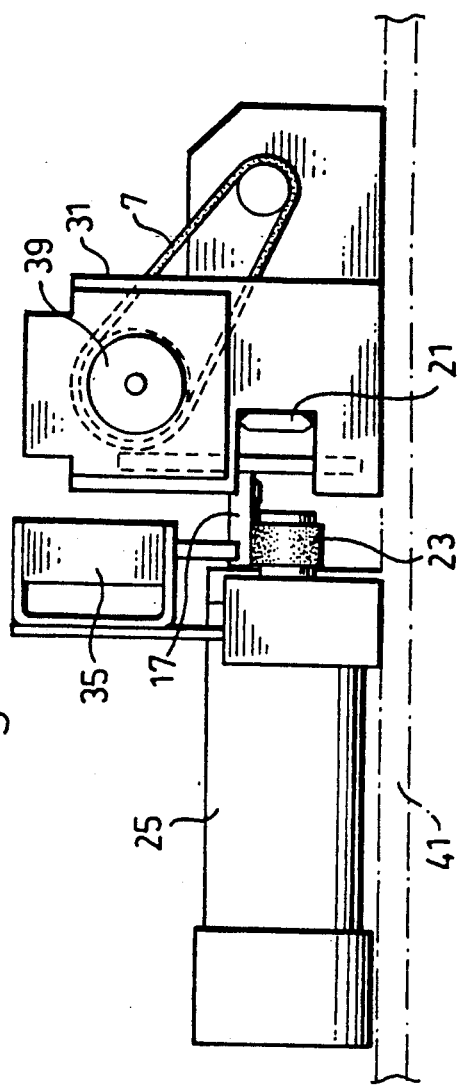

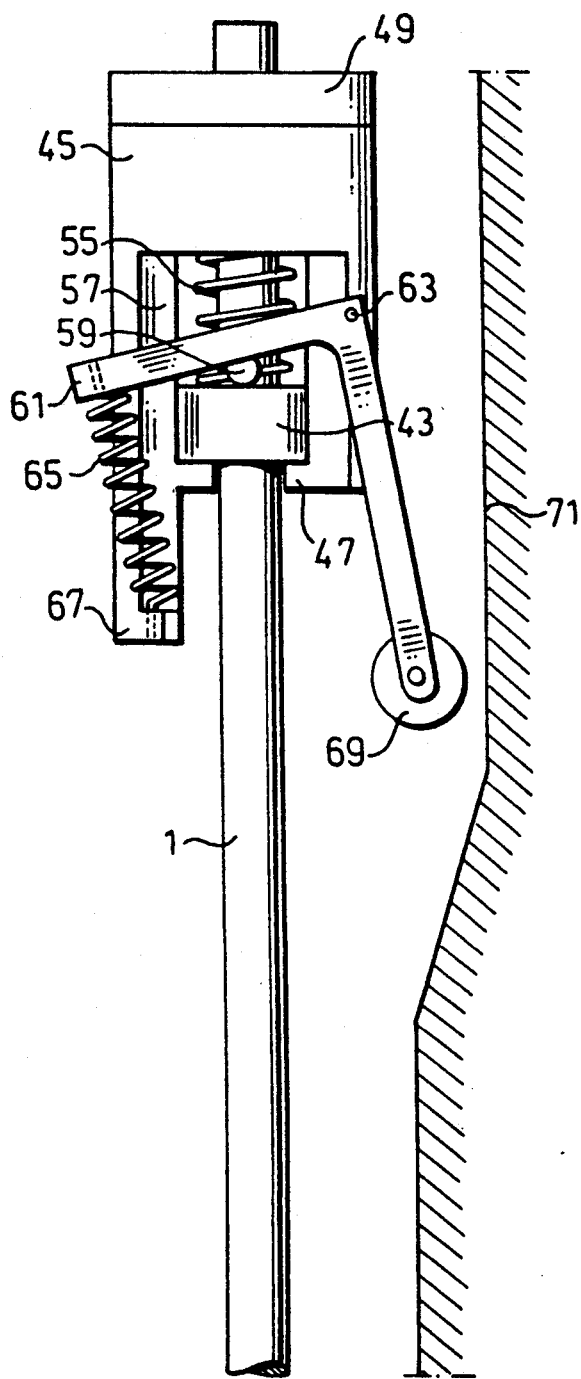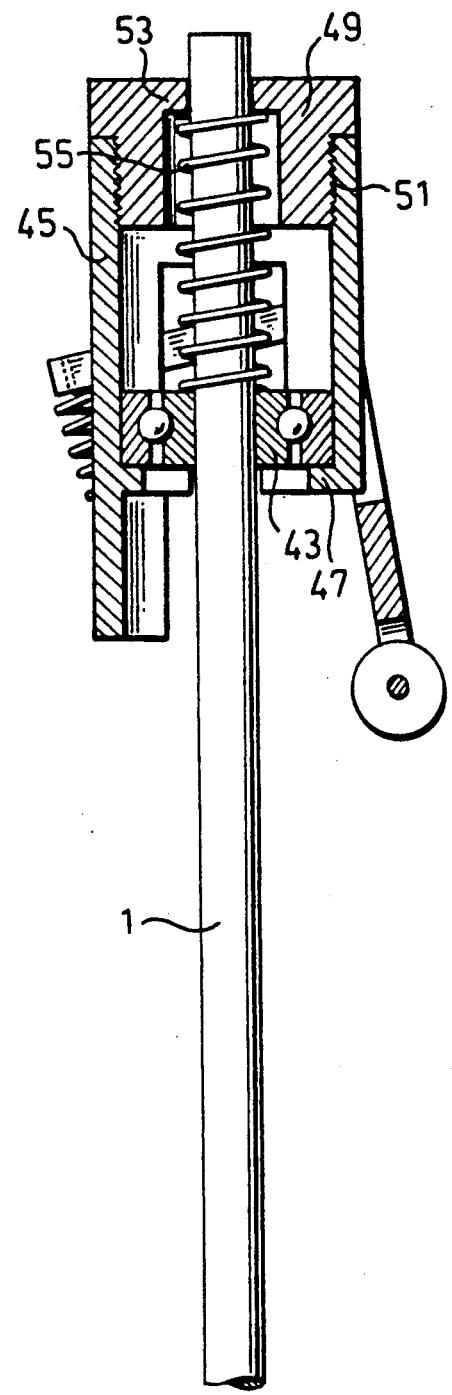

MOVABLE TOOL HEAD FOR MOUNTING MACHINES AND A ROTATABLE, AXIALLY MOVABLE SHAFT THEREFOR

BACKGROUND OF THE INVENTION

The present invention relates to a movable tool head for mounting machines and a rotatable shaft mounted for axial movements for such a head.

Tool heads of this kind are used e.g. in machines for automatic mounting of electronic componenets on printed circuit boards. In these machines the tool head is to be moved from a component supply to the place where said component is to be mounted. At the supply the component is seize by means of a suitable tool attached to the tool head. The tool head then moves said component upwards from the component supply, moves in the horizontal plane and is positioned just above the place where the component is to be placed. Then the component is lowered until it hits a printed board. When the component contacts said board this is detected and then the component is released from the tool head.

Naturally it is preferred that the movements of a tool head, as described above, can be made very rapidly. In conventional tool heads also at least one driving motor is displaced vertically when the component is seized from the supply and then is lowered down to the printed board. The inertia of this driving motor necessarily makes these up-and down movements slow. This is avoided in the tool head according to the invention and the invention thus provides a tool head which can make a very fast mounting movement upwards and downwards.

The features and the scope of the invention is given in the appended claims.

SUMMARY OF THE INVENTION

According to the invention a shaft is used which is both rotatable and axially displaceable. To this axis a suitable tool is attached to seize and then release the component. The shaft is first moved in its axial direction down to the component supply and there the tool seizes a component. The shaft is then moved upwards in its axial direction. The tool head together with the tool and the seized component then moves to the position where the component is to be placed. The tool shaft is rotated to the correct angular position and then the shaft is moved in its axial direction down towards the mounting board. To perform the rotating and longitudinal movements of said tool shaft there are two drive motors rigidly attached to the base plate or frame of said tool head.

The tool shaft is guided in a rotating linear guiding element. Various linear bearings are known in the art. SE B No. 339,807 discloses a linear bearing having an interior tool shaft which has a square section. This structure provides an excellent capacity for heavy loads but its precision is not too good. A significantly better precision is obtained with a tool shaft having a section with corners forming an angle of 90° or less and which is guided by adapted rolling elements located adjacent to the edges associated with these corners. In the prior art rolling elements having a central groove are used and possible these rolling elements may be divided into two rollers placed on the same shaft, as is e.g. illustrated in SE C No. 434,304. Such a bearing may in certain cases have an unsufficient capacity for absorbing heavy loads. Linear bearings are also shown in DE B No. 1 190 265 and DE Al No. 3 436 977. In the latter document a linear bearing is disclosed apparently having both good capacity for carrying heavy loads and a good precision. However, the rollers contacting the surfaces of the inner shaft are located in such a way that the bearing is space-consuming and also is not adapted to be built into a rotatable house. The weight of this bearing will also be too large for the application described above. Also it should be observed here that in this document the outer surrounding element is displaceable on the inner element.

BRIEF DESCRIPTION OF THE DRAWINGS

The invention will now be described with reference to the accompanying drawings, on which:

FIG. 4 is a detailed plan view of the tool head in FIG. 2, FIG. 5 is a detailed elevational view of the tool head in FIG. 3, FIG. 6 is a front view of the tool head in FIG. 3, FIG. 7 is a schematical view of the rear portion of the rotatable shaft, this being movable aslo axially, and FIG. 8 is a sectional view of the embodiment in FIG. 7.

DETAILED DESCRIPTION OF THE PREFERRED EMBODIMENTS

Figure 1:
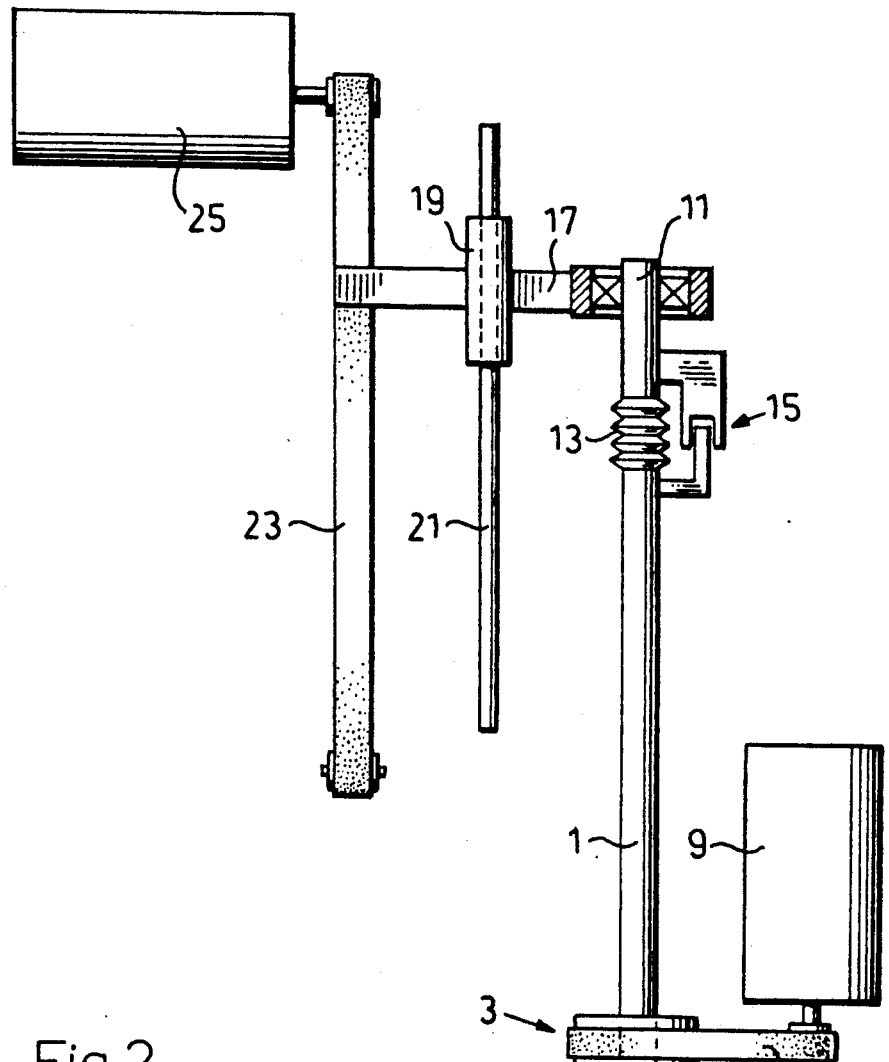
FIG. 1 is a schematical view of the tool head according to the invention, the parts shown being mounted on a generally vertical base plate.

FIG. 1 is a principal view of a first embodiment of the invention. The shown commponents are generally, by means of suitable elements, attached to a plate being generally vertical and movable in a horizontal plane between a component supply and a portion, where a component is to be place. A tool shaft 1 is movable upwards as well as downwards and is simultaneously rotatable. To this end the shaft 1 is guided in a front bearing being generally referenced 3. In this bearing 3 the shaft 1 can move in an axial direction, preferably without play. The front bearing 3 comprises a tubular housing 5, which by suitable means is rotated when this is necessary, e.g. when a component should be aligned to be placed on its correct position. This means can, as is shown in the figure, comprise a belt 7, e.g. a toothed belt, passing on the outside of the housing 5 and also over a driving wheel on a driving motor 9 suitably arranged and having an axis parallel to the shaft 1. The housing 5 is rotatably supported by suitable supporting means attached to the vertical base plate, not shown, and is not movable in an axial direction. At its front free end the tool shaft 1 is shaped in a suitable way in order to attach a suitable tool (not shown). At its rear end the shaft 1 is resiliently attached to a rear shaft portion 11. The resilient attachment 13 is made in such a way that the tool axis 1 and the rear shaft portion 11 can be displaced a little axially relatively to each other, e.g. when the tool shaft 1 hits an obstacle in a forward motion. In contrast there is no appreciable possibility of a radial movement of the tool shaft 1 and the rear shaft portion 11 in relation to each other.

Associated with the elastic attachment 13 is a detector 15 which senses when the tool shaft 1 and the rear shaft portion 11 are moved in an axial direction in relation to each other. In this way, for instance, the shock can be detected which is generated when a component seized by the tool hits a mounting plate.

The rear shaft portion is rotatably supported and without any play in the axial direction by a supporting element 17. This supporting element is movable by means of a linear bearing 19 in the direction of the shaft 1. The bearing 19 cooperates with a linear guide bar 21 supported by the base plate by suitable means. The supporting element 17 is further arranged to be positioned axially by some suitable means. In the embodiment shown this is realized by a belt 23, e.g. a toothed belt, attached to said support element 17 and driven by a motor 25.

Figure 2:
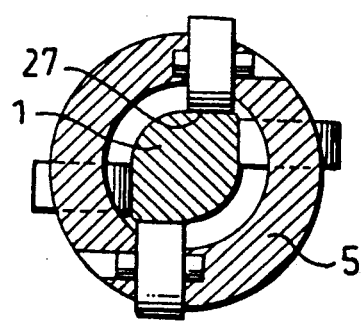
FIG. 2 is a schematical sectional view of the front part of the front bearing of a tool shaft along the line II—II in FIG. 1.

In FIG. 2 is shown a section of the front part of the front bearing 3. The housing 5 is e.g. a cylindrical element provided with a concentrical bore. In this bore the shaft 1 is supported. The shaft 1 is further provided with essentially plane surfaces 27 cooperating with rotatable elements, for instance rolling bearings 29, rotatably mounted in the housing 5. The essentially plane surfaces 27 comprise four surfaces and of these two surfaces, adjacent to each other, are arranged in an angle in relation to each other and are located just opposite to the two other surfaces. Preferably one surface in each of these pairs is parallel to each other and further the surfaces adjacent to each other can be arranged in an angle of 60°-120° in relation to each other, preferably 90°, as shown in the figure. The guide rollers 29 can as well be arranged with an axial displacement, in such a way that those guide rollers 29, which cooperate with mutually parallel surfaces on the shaft 1, are arranged in the same radial plane. In addition one of the bearing rollers 29 may be axially movable and elastically biased, for instance by means of tension springs arranged at the ends of the axis thereof to essentially without play support the tool shaft 1 inside the housing 5.

Figure 3:
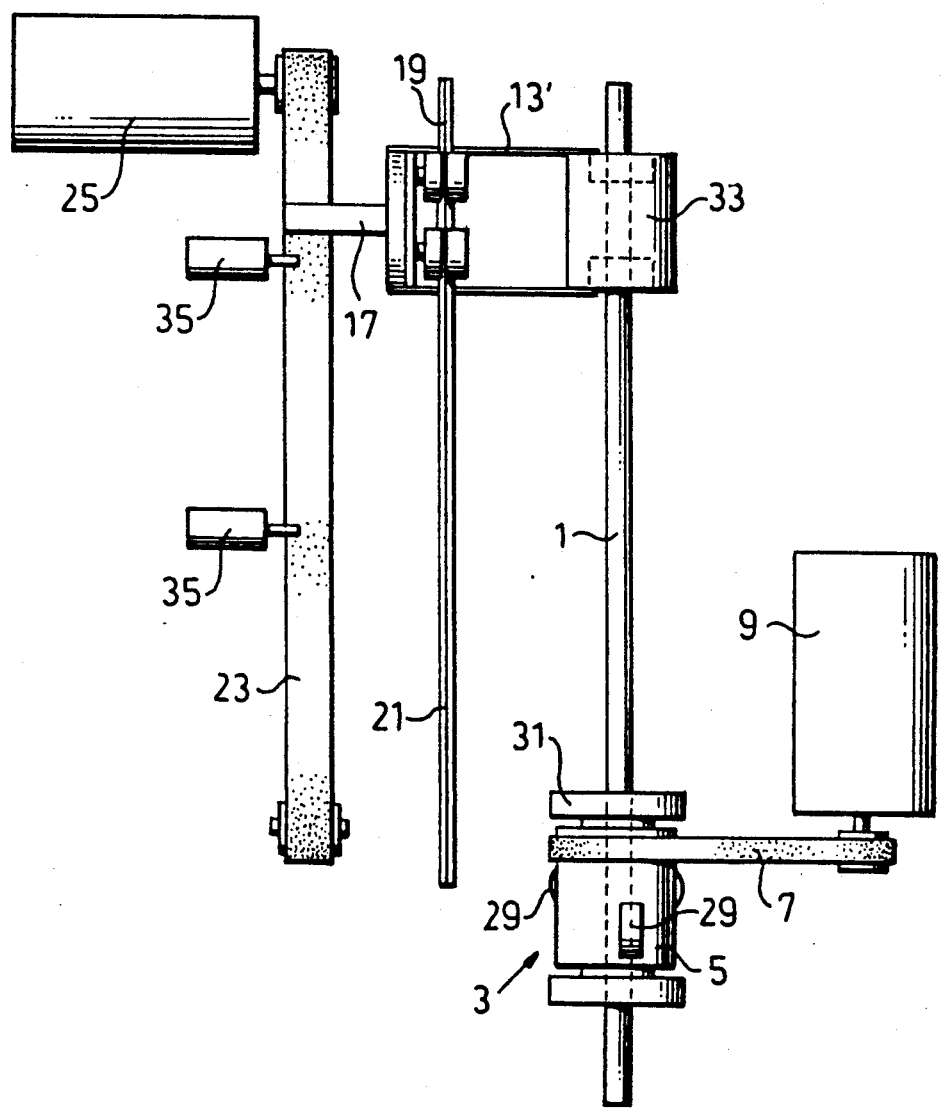
FIG. 3 is a schematical view similar to FIG. 1 of another embodiment of the tool head according to the invention.

In FIG. 3 a schematical view of another embodiment of the invention is shown and this figure also illustrates schematically the construction of some of the common elements. Thus here is shown schematically supports 31 which rotatably carry the front bearing 3. In this embodiment there is no rear shaft portion 11 and the tool shaft 1 is instead rotatably and without any essential axial play attached to a rear support body 33. This support body is elastically connected to a support element 17. The elastical or resilient connection between the support body 33 and the support element 17 can as is shown in the figure, be realized by means of plate springs 13'. In addition there is provided a detector, not shown, sensing the relative movement of the support body 33 and the support element 17 and signalling when these are displaced in relation to each other. The linear bearing 19 can, as is shown, comprise four upper pairs of bearing rollers, e.g. rolling bearings, arranged adjacent to each other. Together with four similarly arranged lower bearing rollers these cooperate with a guide bar 21, the section of which has the shape of an elongated hexagon.

In order to prevent the tool shaft 1 to fall down, for instance in the case of a failure of the main supply, there are provided controllable arresting elements 35. These can be realized as spring loaded solenoids, the pins of which cooperate, as is shown, with the support element 17.

In FIGS. 4, 5, and 6 is shown in more detail a tool head generally according to the embodiment of FIG. 3. Here is shown for instance the tension springs 37 biasing a guiding roller 29 against a lateral surface of the tool shaft 1. A tool 39 is schematically shown to be attached to the front end of the tool shaft 1. The base plate has the reference 41. The lower position of the rear body 33 is indicated with dashed lines in FIG. 4.

It is obvious that the illustrated shape of the section of the front part of the tool shaft 1 and bearing 3 cooperating with this shaft portion can be utilized also for other purposes.

In FIGS. 7 and 8 and alternative embodiment is illustrated of the connection of the tool shaft 1 with the linearly guided support element 17. A rolling bearing 43 having essentially no play, e.g. a radial ball bearing, has its inner ring rigidly attached to the rear end of the tool shaft 1. The outer ring of the rolling bearing 43 is slideably supported, particularly axially, in a sleeve 45. The sleeve 45 is at its one end provided with an inwardly protruding flange 47 forming a stop for the rolling bearing 43. At its other end the sleeve 45 is rigidly attached to a rear stop element 49. The stop element 49 can, for instance by means of a threaded connection 51, be attached to the sleeve 45. The rear stop element 49 also serves as a stop for the rolling bearing and is provided with a radially inwards directed protrusion 53 forming one abutment surface of a compression spring 55. This spring 55, being relatively soft, has its other end engaged with the inner ring of the rolling bearing 43. At its front end the sleeve element 45 is provided with two plane chamferings 57 parallel to the tool shaft 1. These chamferings are made so deep that the outer ring of the rolling bearing 43 extends above the surfaces of these chamferings 57. In this way the rear surface of the outer ring of the rolling bearing 43 can be engaged with a supporting extention 59 on a fork-shaped lever 61. The lever 61 has its both fork legs bent in an angle and it is rotatably fixed, approximately at the point of this angle, in the sleeve element 45 on the plane surfaces 57. The lever 61 has its one end elastically biased by a tension spring 65, this spring having its other end attached to an extension 67. This extension 67 protrudes forwards axially from the sleeve 45. At its other end the lever 61 is provided with a roller 69 rolling on a race 71 arranged adjacent to the tool shaft 1. Further, the sleeve 45 is in some suitable way connected to the support element 17 of FIG. 1.

The device illustrated in FIGS. 7 and 8 operates in the following way. The springs 55 and 65 have the same direction of operation, but the spring force of the two springs 65 is significantly larger than the spring force derived from the spring 55. The race 71 is shaped in such a way that when the tool shaft 1 is at its upper or rear position, the roller 69 does not contact the race 71. In this way the rolling bearing 43 is pushed with a significant force against the stop 47 inside the sleeve 45. The soft spring 55 would not by itself be able to maintain the rolling bearing 43 in abutment with the stop 47 during a rapid acceleration normally taking place in this region. When the tool shaft 1 is displaced forwards or downwards and will hit a possible component plate after some time, the roller will contact the higher portion of the race 71, arranged in this region. In this way, the rolling bearing 43 is released from being influenced of the lever 61 through the support means 59. Thus, in this region only the soft spring 55 is operative on the rolling bearing 43 and thus also on the tool shaft 1. The shock or retardation obtained when the tool shaft with the associated component hits the component plate, can then easily be detected, for instance by means of suitable sensors (not shown) arranged at the rear stop element 49 and cooperating with means arranged on the rear end of the tool shaft 1.

I claim:

1. A movable tool head comprising:
    an elongated, rotatable and axially movable tool shaft having a rotational axis and a plurality of longitudinal guide surfaces, each said guide surface having a center;
    a housing configured as a sleeve having a center bore through which said tool shaft passes, said housing for rotatably and axially movably supporting said tool shaft, said housing being rotatably supported by and axially fixed to a base element;
    a first driving element rigidly attached to said base element for rotating said housing;
    a second element for rotatably movably supporting and axially fixing said tool shaft, wherein said tool shaft is movable only in a direction parallel to the axis of said tool shaft by a second driving element rigidly attached to said base element;
    four rotatable bearing elements having rotatable axes perpendicular to said axis of said tool shaft and arranged inside said sleeve to cooperate with four longitudinal guide surfaces on said tool shaft, said longitudinal guide surfaces being essentially flat and parallel to said axis of said tool shaft;
    two of said guide surfaces forming a first pair disposed at an angle to each other, the remaining two of said guide surfaces forming a second pair disposed at the same angle to each other, such that each of said first pair of guide surfaces is parallel to one of said second pairs of guide surfaces;
    wherein a perpendicular plane passes through the center of each guide surface perpendicular to each said guide surface, each of said perpendicular planes being spaced from said axis of said tool shaft, such that said guide surfaces are places asymmetrically with respect to said axis.

2. The movable tool head as defined by claim 1 further comprising a plane passing through the center of each of said rotatable bearing elements perpendicular to the axis of each said bearing element, each of said planes being spaced from said axis of said tool shaft.

3. The movable tool head as defined by claim 1 whrein at least one of said rotatable bearing elements is elastically biased to engage one of said guide surfaces.

4. A movable tool head comprising:
    an elongated, rotatable and axially movable tool shaft having a rotational axis and a plurality of longitudinal guide surfaces, each said guide surface having a center;
    a housing configured as a sleeve having a center bore through which said tool shaft passes, said housing for rotatably and axially movably supporting said tool shaft, said housing being rotatably supported by and axially fixed to a base element;
    a first driving element rigidly attached to said base element for rotating said housing;
    a second element for rotatably movably supporting and axially fixing said tool shaft, wherein said tool shaft is movable only in a direction parallel to the axis of said tool shaft by a second driving element rigidly attached to said base element;
    four rotatable bearing elements having rotatable axes perpendicular to said axis of said tool shaft and arranged inside said sleeve to cooperate with four longitudinal guide surfaces on said tool shaft, said longitudinal guide surfaces being essentially flat and parallel to said axis of said tool shaft;
    two of said guide surfaces forming a first pair disposed at an angle to each other, the remaining two of said guide surfaces forming a second pair disposed at the same angle to each other, such that each of said first pair of guide surfaces is parallel to one of said second pairs of guide surfaces;
    said guide surfaces of each of said pairs being positioned adjacent to each other, the guide surfaces of one of said pairs connected to one of the guide surfaces of the other of said pair through an intermediate surface, said surface being a part of a cylindrical surface coaxial with said axis of said tool sahft; and
    a plane passing through the center of each of said rotatable bearing elements perpendicular to the axis of each said bearing element, each of said planes being spaced from said axis of said tool shaft.

5. A movable tool head comprising:
    an elongated, rotatable and axially movable tool shaft having a rotational axis and a plurality of longitudinal guide surfaces, each said guide surface having a center;
    a housing configured as a sleeve having a center bore through which said tool shaft passes, said housing for rotatably and axially movably supporting said tool shaft, said housing being rotatably supported by and axially fixed to a base element;
    a first driving element rigidly attached to said base element for rotating said housing;
    a second element for rotatably movably supporting and axially fixing said tool shaft, wherein said tool shaft is movable only in a direction parallel to the axis of said tool shaft by a second driving element rigidly attached to said base element;
    four rotatable bearing elements having rotatable axes perpendicular to said axis of said tool shaft and arranged inside said sleeve to cooperate with four longitudinal guide surfaces on said tool shaft, said longitudinal guide surfaces being essentially flat and parallel to said axis of said tool shaft;
    two of said guide surfaces forming a first pair disposed at an angle to each other, the remaining two of said guide surfaces forming a second pair disposed at the same angle to each other, such that each of said first pair of guide surfaces is parallel to one of said second pairs of guide surfaces;
    said guide surfaces of each of said pairs being positioned adjacent to each other, the guide surfaces of one of said pairs connected to one of the guide surfaces of the other of said pair through an intermediate surface, said surface being a part of a cylindrical surface coaxial with said axis of said tool shaft; and
    having a plane passing through the center of eacch of said parallel guide surfaces of said first pair and said second pair, said planes being spaced a distance from the axis of said tool shaft and from each other, such that said guide surfaces are placed asymmetrically with respect to said axis.

* * * * *